(12) United States Patent
Pasadyn et al.

(10) Patent No.: US 7,581,140 B1
(45) Date of Patent: Aug. 25, 2009

(54) INITIATING TEST RUNS BASED ON FAULT DETECTION RESULTS

(75) Inventors: Alexander J. Pasadyn, Austin, TX (US); Elfido Coss, Jr., Austin, TX (US); Brian K. Cusson, Austin, TX (US); Naomi M. Jenkins, Round Rock, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 1560 days.

(21) Appl. No.: 10/323,529

(22) Filed: Dec. 18, 2002

(51) Int. Cl.
*G06F 11/00* (2006.01)
(52) U.S. Cl. ........................................ 714/37
(58) Field of Classification Search .................. 714/37, 714/25; 438/17, 5; 324/765; 700/121
See application file for complete search history.

(56) References Cited

U.S. PATENT DOCUMENTS

| | | | | |
|---|---|---|---|---|
| 5,940,300 A * | 8/1999 | Ozaki | .......................... | 700/121 |
| 6,090,632 A * | 7/2000 | Jeon et al. | ...................... | 438/14 |
| 6,560,503 B1 * | 5/2003 | Toprac et al. | ............... | 700/108 |
| 6,629,009 B1 * | 9/2003 | Tamaki | ...................... | 700/108 |
| 6,766,208 B2 * | 7/2004 | Hsieh | .......................... | 700/109 |
| 6,890,773 B1 * | 5/2005 | Stewart | ....................... | 438/14 |

\* cited by examiner

*Primary Examiner*—Michael C Maskulinski
*Assistant Examiner*—Amine Riad
(74) *Attorney, Agent, or Firm*—Williams, Morgan & Amerson, P.C.

(57) ABSTRACT

A method and apparatus are provided for initiating test runs based on a fault detection result. The method comprises receiving operational data associated with processing of a workpiece by a processing tool, processing the operational data to determine fault detection results; and causing a test run to be performed based on at least a portion of the fault detection results.

19 Claims, 3 Drawing Sheets

INITIATING TEST RUNS BASED ON FAULT DETECTION RESULTS

BACKGROUND OF THE INVENTION

1. Field of the Invention

This invention relates generally to an industrial process, and, more particularly, to initiating test runs in a semiconductor fabrication runs based on fault detection results.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in continual improvements in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

During the fabrication process, various events may take place that affect the performance of the devices being fabricated. That is, variations in the fabrication process steps may result in device performance variations. Factors, such as feature critical dimensions, doping levels, contact resistance, particle contamination, etc., all may potentially affect the end performance of the device. Various tools in the processing line are controlled, in accordance with performance models, to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

Processing tools are routinely calibrated to reduce process variations. Test runs, such as qualification runs or experimental runs, are commonly conducted to calibrate the processing tools or diagnose processing problems associated with the processing tools. The tests runs are typically triggered at scheduled intervals, such as every 24 hours, or are initiated by the occurrence of selected events, such as preventative maintenance events. Unfortunately, these test runs are initiated at scheduled times or events regardless of whether the processing tools require calibration. As such, valuable time and resources, in the form of wafers, for example, may be wasted, in instances where calibration of the processing tools may not be necessary.

The present invention is directed to overcoming, or at least reducing the effects of, one or more of the problems set forth above.

SUMMARY OF THE INVENTION

In one embodiment of the present invention, a method is provided for initiating test runs based on a fault detection result. The method comprises receiving operational data associated with processing of a workpiece by a processing tool, processing the operational data to determine fault detection results; and causing a test run to be performed based on at least a portion of the fault detection results.

In another embodiment of the present invention, an apparatus is provided for initiating test runs based on a fault detection result. The apparatus comprises an interface communicatively coupled to a control unit. The interface is adapted to receive operational data associated with processing of a workpiece by a processing tool. The control unit is adapted to determine a health value associated with the processing tool based at least on the received operational data and cause a test run to be performed based on the determined health value.

In a further embodiment of the present invention, an article comprising one or more machine-readable storage media containing instructions is provided for initiating test runs based on a fault detection result. The one or more instructions, when executed, enable the processor to receive operational data associated with processing of a workpiece by a processing tool, determine a health value associated with the processing tool based at least on the received operational data and cause a test run to be performed based on the determined health value.

In a further embodiment of the present invention, a system is provided for initiating test runs based on a fault detection result. The system comprises a processing tool and a fault detection and classification unit. The processing tool is adapted to provide operational data associated with processing of a workpiece. The fault detection and classification unit is adapted to receive the operational data, determine a health value associated with the processing tool based at least on the received operational data and cause a test run to be performed based on the determined health value.

BRIEF DESCRIPTION OF THE DRAWINGS

The invention may be understood by reference to the following description taken in conjunction with the accompanying drawings, in which like reference numerals identify like elements, and in which.

Figure 1:
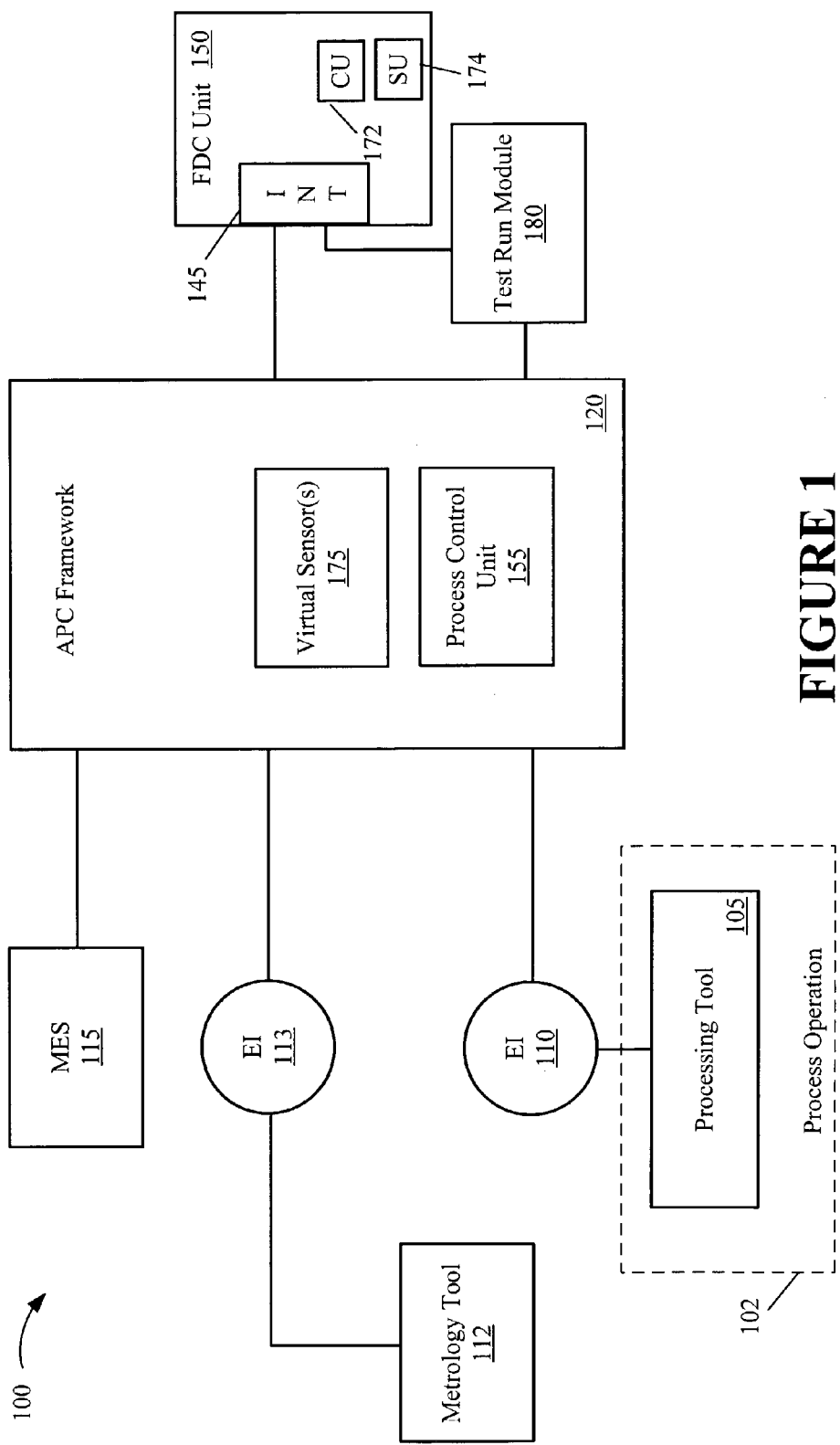
FIG. 1 illustrates an industrial system, including an APC framework, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a block diagram of a system 100 is illustrated, in accordance with one embodiment of the present invention. The system 100, in the illustrated embodiment, includes at least one process operation 102 that may be part of an industrial process, such as a semiconductor fabrication process, a photographic process, a chemical process, or any other process in which a plurality of variables, such as temperature, tool parameters, pressure level, chemical compositions, and the like may be monitored and analyzed. The variables may be monitored and analyzed, for example, to detect faults and/or classify the detected faults.

In the system 100, the process operation 102 may be performed using one or more processing tools 105. Generally, the particular type of process operation 102 that is performed and the type of processing tool(s) 105 employed in that process operation 102 depend on the particular implementation. For example, in the context of a chemical industrial process, the process operation 102 may include processing a polymer. In the context of a photographic process, the process operation 102 may, for example, include processing film.

In one embodiment, the process operation 102 depicted in FIG. 1 may perform a semiconductor fabrication process, which, for example, may be part of an overall semiconductor process flow. To this extent, the processing tool 105 may take the form of any semiconductor fabrication equipment used to produce a processed workpiece, such as a silicon wafer. The semiconductor process may be utilized to produce a variety of integrated circuit products including, but not limited to, microprocessors, memory devices, digital signal processors, application specific integrated circuits (ASICs), or other similar devices. An exemplary processing tool 105 may include an exposure tool, an etch tool, a deposition tool, a polishing tool, a rapid thermal anneal processing tool, a test-equipment tool, an ion implant tool, a packaging tool and the like. It should be appreciated that the processing tool 105 need not necessarily be limited to the processing of silicon wafers, but may produce a variety of different types of commercial products without departing from the spirit and scope of the present invention.

In the system 100 of FIG. 1, the processing tool 105 has an associated equipment interface 110, and a metrology tool 112 has an associated equipment interface 113, for interfacing with an Advanced Process Control (APC) framework 120. In one embodiment, the metrology tool 112 measures aspects of the workpieces that are processed in the process operation 102. In the context of a semiconductor manufacturing process, the metrology tool 112 may provide wafer-related data that characterizes the quality of the wafer that is processed by the processing tool 105. The wafer product data can be generated from specific quantitative and/or qualitative measurements that are taken from the wafer by the metrology tool 112. For example, the wafer product data may include film thickness measurements, line width measurements, and/or overlay offset measurements of the wafer. It will be appreciated that these specific measurements that define the wafer product data are merely exemplary. Accordingly, various other measurements may also be taken to determine whether the wafers that are being processed by the processing tool 105 possess the quantitative or qualitative characteristics desired. The specific manner in which the wafer product data is obtained by the metrology tool 112 is well known to those of ordinary skill in the art and the details of such will not be discussed herein to avoid unnecessarily obscuring the present invention.

The equipment interface 113 may receive metrology data from the metrology tool 112 and communicate this data to the APC framework 120, which may include a control unit 155 for managing at least the overall operations of the APC framework 120. In addition, the processing tool 105 or a sensor external (not shown) to the processing tool 105 may provide data related to the processing of the workpieces (e.g., semiconductor wafers) to the APC framework 120. The data provided by the processing tool 105 is hereinafter referred to as "trace data," which, in one embodiment, may be provided in substantially real time. The metrology data, trace data associated with the operating states of the processing tool 105, or any other data related to the processing of the workpieces, is hereinafter referred to as "operational data."

The system 100 may include a manufacturing execution system (MES) 115 that is coupled to the APC framework 120. The manufacturing execution system 115 may, for example, determine the processes that are to be performed by the processing tool 105, when these processes are to be performed, how these processes are to be performed, etc. In one embodiment, the MES 115 communicates directly with the equipment interfaces 110, 113. The process control unit 155 of the APC framework 120, in one embodiment, aids the processing tool 105, through a feedback (or feedforward) process, towards performing a desired process to thereby achieve a desired result.

An exemplary APC framework 120 that may be suitable for use in the manufacturing system 100 may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI, which is headquartered in Mountain View, Calif.

The system 100, in the illustrated embodiment, includes a fault detection and classification (FDC) unit 150 that is coupled to the APC framework 120 via an interface 145. The interface 145 may be any acceptable structure(s) that allow(s) the FDC unit 150 to communicate with other devices. The FDC unit 150 includes a control unit 172 for managing the overall operations and executing one or more software applications resident in a storage unit 174.

The FDC unit 150, in one embodiment, detects faults associated with the processing tool 105. In another embodiment, the FDC unit 150 may classify one or more of the detected faults. Although in the illustrated embodiment, the FDC unit 150 detects faults at the "tool" level, in alternative embodiments, the FDC unit 150 may detect faults at any desirable level, including at a sensor level, process level, system level, and the like.

Faults may occur in a manufacturing process for various reasons, including occurrence of an unknown disturbance, hardware failure, depletion of resources (e.g., gases, liquids, chemicals), and the like. The faults may be detected in several ways, including detecting a fault based on analyzing metrology data provided by the metrology tool 112 and/or trace data provided by the processing tool 105. The FDC unit 150, for example, may detect a fault associated with the processing tool 105 if the received metrology data indicates that values measured from the workpieces are outside an acceptable range. The FDC unit 150, in another embodiment, may also detect a fault based on comparing the received trace data from the processing tool 105 to fault model data. The fault model data includes operational data of other similar-type tools, where it was previously known that such tools had operated within acceptable operational limits.

The system 100 in the illustrated embodiment includes one or more virtual sensors 175, which may be implemented in software, hardware or a combination thereof. The virtual sensor(s) 175 may collect data associated with a variety of elements or components in the system 100 and provide the collected data to the FDC unit 150. For example, in one embodiment, the virtual sensor(s) 175 may provide information regarding run-to-run processing, such as disparities between runs. To provide comparison of run-to-run data, the APC framework 120 may store data from the past runs for a basis of comparison to other runs. In one embodiment, the APC framework 120 may receive data associated with the previous process step (i.e., feed forward data) and provide the data to the FDC unit 150. In one embodiment, the virtual sensor(s) 175 may provide data regarding the performance level (or state) of the control unit 155. In alternative embodiments, the virtual sensor(s) 175 may gather other types of data, depending on the particular implementation.

As described in more detail below, in accordance with one or more embodiments of the present invention, the results from the FDC unit 150 are provided to a test run (TR) module 180, which determines whether it is desirable to perform one or more test runs, for example, to calibrate the processing tool 105 based at least on the FDC results. A variety of test runs may be performed, including a qualification run and an experimental run. Qualification runs may be runs that are regularly scheduled to initialize the starting state of the processing tool 105 or to calibrate the processing tool 105 to a desired state(s). Experimental runs may include runs that are performed for a special or specific purpose, such as to diagnose potential problems with the processing (e.g., to determine if the cause of the problem is the processing tool 105 itself or a defect in the incoming workpiece). In an alternative embodiment, the FDC unit 150 detects and classifies faults, and the TR module 180 determines which types of test runs to perform based on the classification of the faults.

It should be appreciated that the illustrated components shown in the block diagram of the system 100 in FIG. 1 are illustrative only, and that, in alternative embodiments, additional or fewer components may be utilized without deviating from the spirit or scope of the invention. For example, in one embodiment, the MES 115 may interface with the APC framework 120 through an associated equipment interface (not shown). Furthermore, in one embodiment, the various components of the system 100, such as the tools 105, 112 may interface with the APC framework 120 through a common equipment interface. Additionally, it should be noted that although various components, such as the equipment interfaces 110, 113 of the system 100 of FIG. 1 are shown as stand-alone components, in alternative embodiments, such components may be integrated into the processing tools 105 or metrology tool 112. Furthermore, selected elements of the system 100, such as the control unit 155 and the TR module 180, may be implemented in a single/common device, or the TR module 180 and the FDC unit 150 may be implemented in a common device. Similarly, the virtual sensor(s) 175 may be integrated with the FDC unit 150, the control unit 155, or the TR module 180. In one embodiment, the system 100 of FIG. 1 may be implemented without an APC framework 120.

Figure 2:
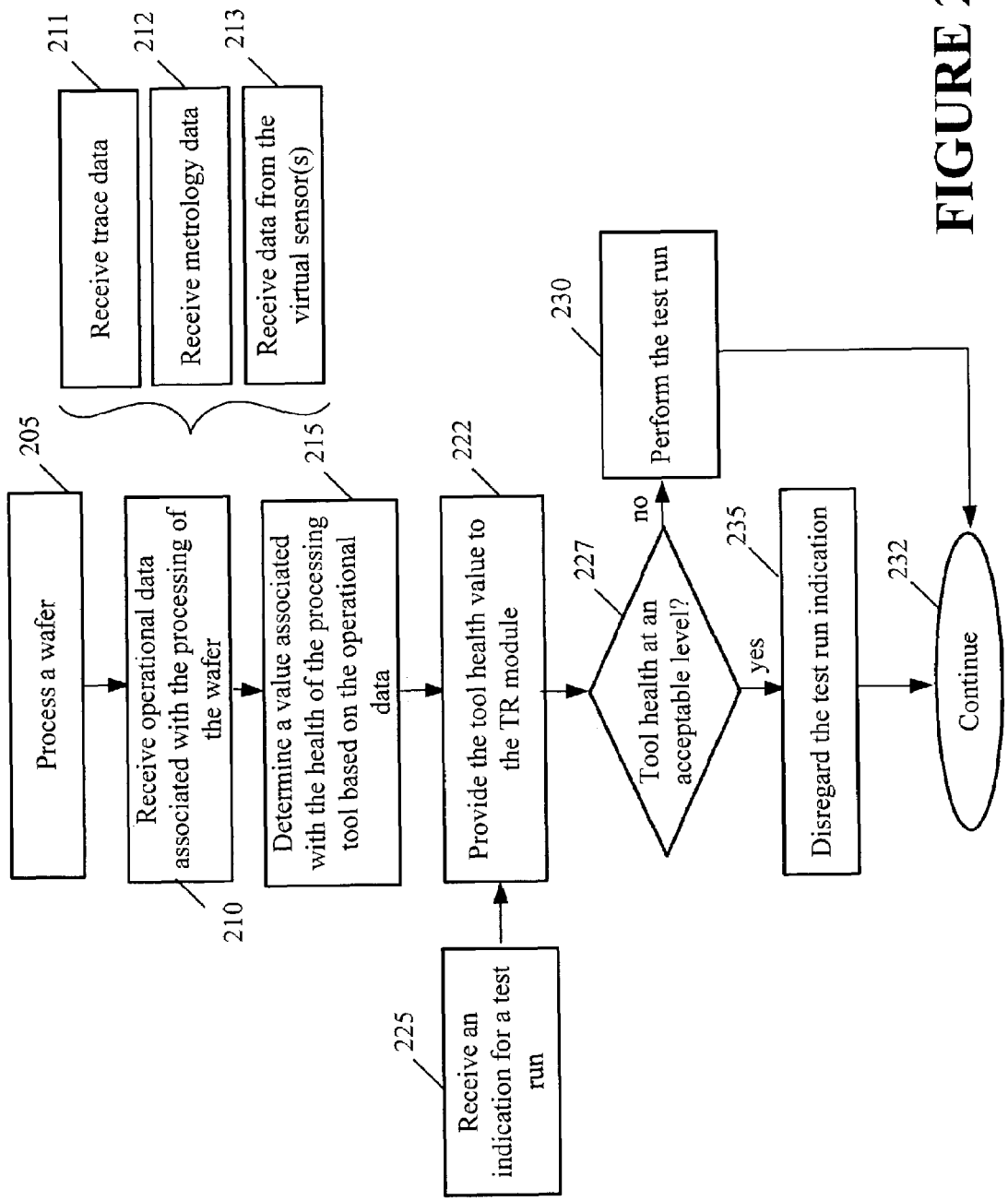
FIG. 2 illustrates a flow diagram of a method that may be implemented in the system of FIG. 1, in accordance with one embodiment of the present invention.

Referring now to FIG. 2, a flow diagram of a method that may be implemented in the system 100 of FIG. 1 is illustrated, in accordance with one embodiment of the present invention. The processing tool 105 processes (at 205) a workpiece (e.g., a wafer in the context of a semiconductor fabrication process). In one embodiment, the processing tool 105 may process a batch of workpieces.

As the workpiece is processed (at 205), the processing tool 105 may provide operational data, in the form of metrology and/or trace data, associated with the processing of the wafer to the FDC unit 150. In another embodiment, the metrology tool 112 may provide metrology data associated with the processing of the workpiece (at 205) to the FDC unit 150.

The FDC unit 150 receives (at 210) the operational data associated with the processing of the workpiece. Receiving the operational data (at 210), in one embodiment, may include receiving (at 211) trace data from the processing tool 105. In one embodiment, the FDC unit 150 may receive (at 212) metrology data. In another embodiment, the FDC unit 150 may receive (at 213) data provided by the virtual sensor(s) 175.

The FDC unit 150 determines (at 215) a value associated with the health of the processing tool 105 based on the received operational data. One technique for determining tool health value is to employ a multivariate tool health model (not shown) that is adapted to predict the expected operating parameters of the processing tool 105 during the processing of workpieces. If the actual tool parameters are close to the predicted tool parameters, the processing tool 105 may have a high health rating (i.e., the tool is operating as expected). As the gap between the expected tool parameters and the actual tool parameters widens, the tool health rating decreases.

The FDC unit 150 provides (at 222) the tool health value to the TR module 180. The TR module 180 receives (at 225) an indication for a test run. The indication, for example, may have been scheduled to occur at preselected time intervals or they may be event driven, such as by a periodically scheduled preventative maintenance event. The TR module 180, in one embodiment, may monitor for requests to perform test runs.

If the TR module 180 receives a test run indication, then the TR module 180 determines (at 227) whether the health of the processing tool 105 is at an acceptable level. In one embodiment, the tool health value may be compared to a threshold value to determine if the processing tool 105 is operating at an acceptable level. In one embodiment, the threshold value may be a range of values, where the range of values defines the acceptable operating range of the processing tool 105.

Once the TR module 180 receives the test run indication, and determines (at 227) that the processing tool 105 is not operating at an acceptable level, then the TR module 180 performs (at 230) the test run. The TR module 180 may perform the test run in this case because the tool health value indicates that the processing tool 105 is not operating as desired and thus, for example may need to be recalibrated. In one embodiment, test run indications may not be employed, in which case the TR module 180 may schedule a test run or runs based on determining that the tool health is not at an acceptable level. That is, the TR module 180 may schedule a test run or runs automatically after determining that the tool health value is below the preselected threshold value. Upon the completion of the test run, the process continues (at 232) with normal operation.

If, after receiving the test run indication, the TR module 180 determines (at 227) that the processing tool 105 is operating at an acceptable level, then the TR module 180 disregards (at 235), or alternatively postpones, the test run. The TR module 180 may not perform the test run in this case because the tool health value indicates that the processing tool 105 is operating as desired, and that recalibration or preventative maintenance event may not be needed. As such, the TR module 180 saves time and resources by skipping or postponing test runs that add little value, in view of the fact that the processing tool 105 is operating as desired. Postponing the test runs allows the processing tool 105 to be operated on a more flexible schedule (i.e., the test runs may be deferred for a more convenient time), thereby allowing the processing tool 105 to continue operating without any immediate interruptions.

In one embodiment, one or more of the acts described in the method of FIG. 2 can be implemented in substantially real time. Additionally, the acts of the method of FIG. 2 may vary depending on the arrangement of various components of the system 100 of FIG. 1. For example, if the TR module 180 is implemented within the FDC unit 150, then the act of providing the tool health value (at 222) may be omitted. Similarly, depending on the arrangement of the various components of the system 100 of FIG. 1, the acts of the method of FIG. 2 may vary from one implementation to another.

Figure 3:
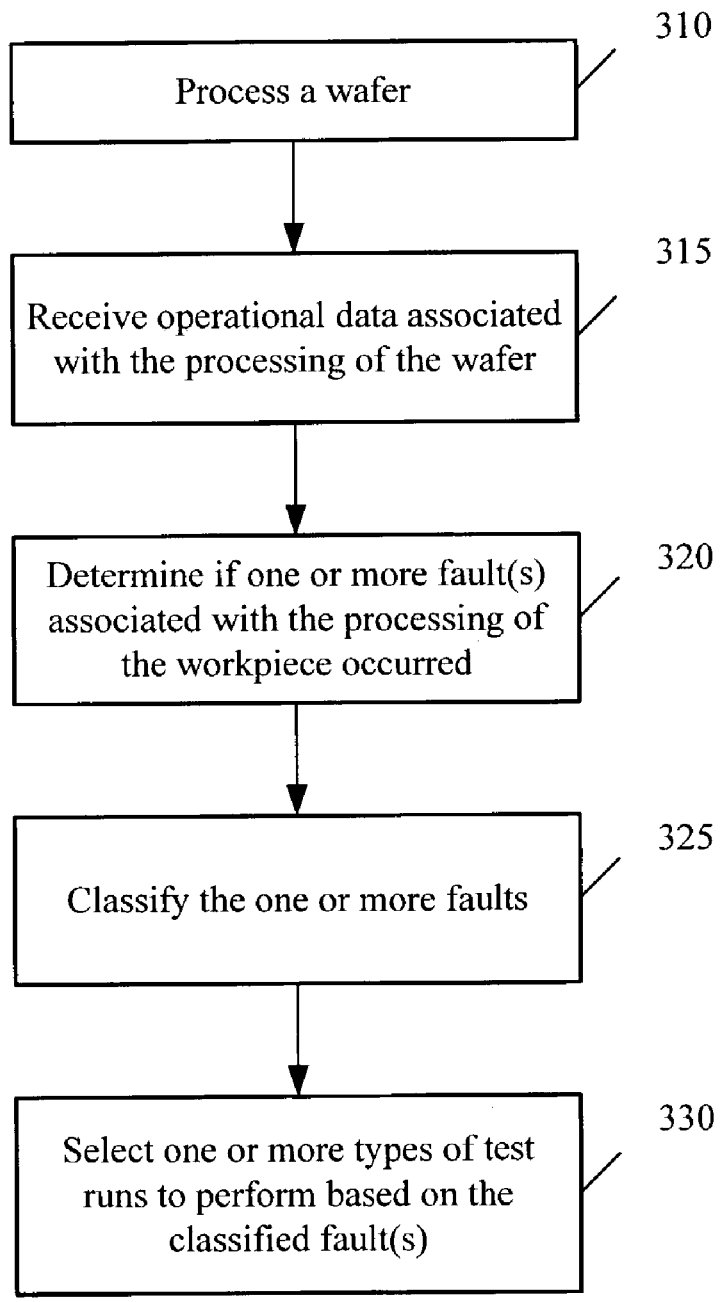
FIG. 3 illustrates a flow diagram of an alternative embodiment of a method that may be implemented in the system of FIG. 1.

Referring now to FIG. 3, a flow diagram of an alternative embodiment of a method is illustrated. The processing tool 105 processes (at 310) a workpiece. The FDC unit 150 receives (at 315) the operational data associated with the processing of the workpiece. The various types of operational data are described above, and are not repeated herein.

The FDC unit 150 determines (at 320) if one or more faults associated with the processing of the workpiece occurred based on the operational data. The FDC unit 150 may detect faults in one of a variety of ways, including compare at least a portion of the operational data to one or more fault models (not shown). In another embodiment, detecting the faults may include determining if the operational data (e.g., metrology data) indicates that the measured characteristics of the processed workpiece are within an acceptable range. The types of faults that may be detected by the FDC unit 150 include processing and/or operational faults in the industrial process. In the context of a semiconductor fabrication process, examples of processing faults may include, but are not necessarily limited to, non-optimal preheating of the chamber, catastrophic failure where a broken wafer is detected, abnormal nitrogen (N2) flow rate, temperature overshoots at the top of a ramp, tube temperature measurement drifts, etc. Examples of operational faults detected may include interrupted/resumed processing, no wafer sleuth or improper wafer sleuth prior to Rapid Thermal Anneal (RTA), etc.

The FDC unit 150 classifies (at 325) the one or more detected faults. Classifying the detected faults(s) (at 325) may include determining at least one cause of the detected fault(s), a process sometimes also referred to as "classification." In one embodiment, the FDC unit 150 determines one or more possible causes based on a fault distribution chart, which may be generated by the fault detection and classification unit 150 using a well-known technique of principal component analysis.

The TR module 180 selects (at 330) one or more test runs to perform based the on classification of the fault(s). In one embodiment, the TR module 180 may include a table that associates, for example, a particular type of experimental run with a particular type of fault that is detected by the FDC unit 150. Thus, once a fault is detected, based on the table, the TR module 180 may perform the experimental run that is associated with the detected fault. The experimental run may be performed, for example, to diagnose a cause of a problem encountered with the processing of the workpiece or workpieces. That is, the experimental runs may be performed to narrow or isolate the potential causes of the problem encountered. For example, an experimental run may require running the test workpieces with a different type of film, as compared to a previously used film, to isolate a cause of a problem detected. The types of experimental runs performed will depend on the particular circumstances and the objective sought. In one embodiment, a plurality of experimental runs may be associated with a given fault, where each one of the associated experimental runs is performed in response to detecting that fault.

For reasons explained above, in accordance with one or more embodiments of the present invention, the TR module 180 performs one or more test runs based on the results provided by the FDC unit 150. In this manner, the FDC unit 150 causes the test runs to be performed on an as-needed basis rather than at every scheduled interval. This can reduce the overall number of test runs that may need to be performed, thereby resulting in savings of time and resources, such as workpieces. Additionally, in one embodiment, the results from the FDC unit 150 may be utilized to determine which test runs need to be performed and at what times. That is, based on the faults classified by the FDC unit 150, the TR module 180 may identify one or more experimental runs that should be performed.

The various system layers, routines, or modules may be executable by the control units 155, 172 (see FIG. 1). As utilized herein, the term "control unit" may include a microprocessor, a microcontroller, a digital signal processor, a processor card (including one or more microprocessors or controllers), or other control or computing devices. The storage unit 174 (see FIG. 1) referred to in this discussion may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
 receiving operational data associated with processing a workpiece by a processing tool;
 processing the operational data to determine fault detection results;
 causing a test run to be performed based on at least a portion of the fault detection results;
 wherein processing comprises detecting a fault associated with the processing of the workpiece and classifying the fault and determining a particular type of test run to be performed based on the classification of the fault; and further comprising receiving operational data associated with a processing of the workpiece from an upstream processing tool, and determining a type of test run to be performed based on the operational data received from the processing of the workpiece from the upstream processing tool.

2. The method of claim 1, wherein processing the operational data further comprises processing the operational data to determine a health value associated with the processing tool and causing the test run to be performed further comprises causing the test run to be performed based on the determined health value.

3. The method of claim 2, wherein the test run is caused to be performed based on determining if the health value is greater than a pre-selected threshold.

4. The method of claim 1, wherein causing the test run to be performed comprises causing at least one of a qualification run and experimental run to be performed.

5. The method of claim 1, wherein receiving the operational data comprises receiving at least one of metrology data associated with the processed workpiece and trace data associated with the processing tool.

6. The method of claim 1, wherein receiving the operational data comprises receiving the operational data associated with processing of a semiconductor wafer.

7. A method, comprising:
receiving operational data associated with processing a workpiece by a processing tool;
processing the operational data to determine fault detection results;
causing a test run to be performed based on at least a portion of the fault detection results;
and calibrating the processing tool based on causing the test run to be performed.

8. An apparatus, comprising:
an interface adapted to receive operational data associated with processing of a workpiece by a processing tool; and
a control unit communicatively coupled to the interface, the control unit adapted to:
determine a health value associated with the processing tool based at least on the received operational data;
cause a test run to be performed based on the determined health value; and
calibrate the processing tool based on causing the test run to be performed.

9. The apparatus of claim 8, wherein the control unit is adapted to cause the test run to be performed based on determining if the health value is greater than a pre-selected threshold.

10. The apparatus of claim 8, wherein the control unit is adapted to further detect a fault associated with the processing of the workpiece and classifying the fault.

11. The apparatus of claim 10, wherein the control unit is adapted to determine a particular type of test run to be performed based on the classification of the fault.

12. The apparatus of claim 11, wherein the control unit is adapted to receive operational data associated with a processing of the workpiece from an upstream processing tool, and determine a particular type of test run to be performed based on the operational data received from the processing of the workpiece from the upstream processing tool.

13. The apparatus of claim 8, wherein the processing tool further comprises an associated process controller, wherein the control unit is adapted to receive data from a virtual sensor regarding the operational state of the process controller and to cause at least one of a qualification run and experimental run to be performed based on the data received from the virtual sensor.

14. An article comprising one or more machine-readable storage media containing instructions that when executed enable a processor to:
receive operational data associated with processing of a workpiece by a processing tool;
determine a health value associated with the processing tool based at least on the received operational data; and
cause a test run to be performed based on the determined health value; and
calibrate the processing tool based on causing the test run to be performed.

15. The article of claim 14, wherein the instructions when executed enable the processor to cause the test run to be performed based on determining if the health value is greater than a pre-selected threshold.

16. The article of claim 14, wherein the instructions when executed enable the processor to detect a fault associated with the processing of the workpiece and classifying the fault.

17. The article of claim 16, wherein the instructions when executed enable the processor to receive operational data associated with processing of the workpiece from an upstream processing tool, and determine a particular type of test run to be performed based on the operational data received from the processing of the workpiece from the upstream processing tool.

18. The article of claim 14, wherein the instructions when executed enable the processor to cause at least one of a qualification run and experimental run to be performed.

19. The article of claim 14, wherein the instructions when executed enable the processor to receive the operational data associated with processing of a semiconductor wafer.

* * * * *